(12) United States Patent
Luo et al.

(10) Patent No.: US 10,868,549 B2
(45) Date of Patent: Dec. 15, 2020

(54) METHOD FOR MEASURING STABILITY OF INTERNAL PHASE LOCKED LOOP OF CENTRAL PROCESSING UNIT BY FREQUENCY METER

(71) Applicant: AMLOGIC (SHANGHAI) CO., LTD., Shanghai (CN)

(72) Inventors: Jinyu Luo, Shanghai (CN); Kun Zhang, Shanghai (CN); Jie Feng, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/342,179

(22) PCT Filed: Oct. 31, 2018

(86) PCT No.: PCT/CN2018/113150
§ 371 (c)(1),
(2) Date: Apr. 15, 2019

(87) PCT Pub. No.: WO2019/144671
PCT Pub. Date: Aug. 1, 2019

(65) Prior Publication Data
US 2020/0350917 A1    Nov. 5, 2020

(30) Foreign Application Priority Data

Jan. 24, 2018  (CN) .......................... 2018 1 0069453

(51) Int. Cl.
*H03L 7/099*   (2006.01)
*G06F 11/22*   (2006.01)
*H03B 5/32*    (2006.01)

(52) U.S. Cl.
CPC .......... *H03L 7/099* (2013.01); *G06F 11/2236* (2013.01); *H03B 5/32* (2013.01)

(58) Field of Classification Search
CPC .. H03L 7/099; H03B 5/32; H03B 5/30; G06F 11/2236; G06F 11/2273; G06F 11/2205
See application file for complete search history.

(56) References Cited

U.S. PATENT DOCUMENTS 7,288,998 B2 * 10/2007 Thomsen ................ H03L 1/022
331/10

FOREIGN PATENT DOCUMENTS

CN      101420294 A    4/2009
CN      102571079 A    7/2012
(Continued)

OTHER PUBLICATIONS

International Application No. PCT/CN2018/113150, International Search Report dated Jan. 30, 2019, 10 pages.

*Primary Examiner* — Jung Kim
(74) *Attorney, Agent, or Firm* — Liang & Hennessey LLP; Brian E. Hennessey

(57) ABSTRACT

The present invention provides a method for measuring an internal Phase Locked Loop of a Central Processing Unit (CPU) by a frequency meter, wherein the method comprises following steps: the (CPU) outputting an oscillation excitation signal to a crystal circuit; the crystal signal generating a clock signal; the internal loop respectively outputting the clock signals that does not pass through and passes through the phase locked loop; adopting a frequency meter to receive the clock signals and perform a clock precision test to correspondingly obtain a first test result and a second result; comparing the first test result and the second result to obtain a result of the stability of the phase locked loop. The beneficial effects of the invention: the operation is simple and it does not need to buy an expensive oscilloscope, the accurate precision of the PLL can be measured without the influence of the crystal.

9 Claims, 2 Drawing Sheets

(56) References Cited

FOREIGN PATENT DOCUMENTS

| | | |
|---|---|---|
| CN | 205566265 U | 9/2016 |
| CN | 107589367 A | 1/2018 |

* cited by examiner

METHOD FOR MEASURING STABILITY OF INTERNAL PHASE LOCKED LOOP OF CENTRAL PROCESSING UNIT BY FREQUENCY METER

CROSS-REFERENCE TO RELATED APPLICATIONS

The present application is a national phase of Ser. No. PCT/CN2018/113150 filed Oct. 31, 2018, the entire contents of which are incorporated herein by reference, and which claims priority to and the benefit of Chinese Patent Application No. 201810069453.8 filed Jan. 24, 2018.

BACKGROUND OF THE INVENTION

1. Field of the Invention

The present invention relates to the field of communication, particularly to a method for measuring the stability of an internal Phase Locked Loop of a Central Processing Unit by a frequency meter.

2. Description of the Related Art

The Phase Locked Loop (PLL, also referred to as a phase locked loop) plays an important role in the Central Processing Unit (CPU, also referred to as a central processing unit). The stability of the PLL determines the performance of the CPU, and then determines the stability of the system. The PLL, however, is relevant to the chip design. In use, there is a need to judge the performance and stability of the PLL.

There are two types of solutions in the related art:
1. measuring the jitter of the output signal by using an oscilloscope to reflect the stability of the PLL, but this solution has some limitations, that is, an oscilloscope with a high bandwidth and an active probe are required;
2. measuring the stability of the system directly without measuring PLL.

The disadvantage of performing a measurement by using the oscilloscope is that it requires an expensive oscilloscope to analyze. The disadvantage of measuring the stability of the system without measuring PLL and deducing the stability of the PLL by judging the stability of the system is that the evaluation result is inaccurate.

SUMMARY OF THE INVENTION

Aiming at the existing problems in the art, the present invention provides a method for measuring the stability of an internal Phase Locked Loop of a Central Processing Unit by a frequency meter.

The invention adopts the following technical solutions:
a method for measuring an internal Phase Locked Loop of a Central Processing Unit by a frequency meter, the Central Processing Unit including an internal loop and a crystal circuit; the method including following steps:
  Step S1: the Central Processing Unit outputting an oscillation excitation signal to the crystal circuit;
  Step S2: the crystal signal generating a clock signal according to the oscillation excitation signal;
  Step S3: the internal loop outputting the clock signal that does not pass through the phase locked loop via an output port set on the Central Processing Unit;
  Step S4: adopting a frequency meter connected to the output port to receive the clock signal that does not pass through the phase locked loop and perform a clock precision test to obtain a first test result;
  Step S5: the internal loop outputting the clock signal that passes through the phase locked loop via the output port set on the Central Processing Unit;
  Step S6: adopting the frequency meter connected to the output port to receive the clock signal that passes through the phase locked loop and perform the clock precision test to obtain a second test result; and
  Step S7: comparing the first test result and the second result according to a preset strategy to obtain a result of the stability of the phase locked loop.

Preferably, the crystal circuit includes:
  a passive crystal oscillator, the passive crystal oscillator including a first pin for inputting the clock signal to the internal loop, a third pin for receiving the oscillation excitation signal from the Central Processing Unit, a second pin and a fourth pin being grounded respectively;
  a first resistor, which is connected in parallel with the circuit between the third pin and the fourth pin of the passive crystal oscillator;
  a second resistor, through which the third pin of the passive crystal oscillator is connected to the internal loop;
  a first capacitor, through which the first pin of the passive crystal oscillator is grounded;
  a second capacitor, through which the third pin of the passive crystal oscillator is grounded.

Preferably, the first capacitor is directly connected to the ground of the Central Processing Unit.

Preferably, the second capacitor is directly connected to the ground of the Central Processing Unit.

Preferably, the preset strategy is as follows:
  if it is determined that the deviation between the first test result and the second test result is greater than a preset result, then the phase locked loop is determined as unstable;
  if it is determined that the deviation between the first test result and the second test result is less than the preset result, then the phase locked loop is determined as stable.

Preferably, the output port includes a first sub-output port and a second sub-output port.

Preferably, in Step S3, the first sub-output port is adopted to output the clock signal that does not pass through the phase locked loop.

Preferably, in Step S5, the second-output port is adopted to output the clock signal that does not pass through the phase locked loop.

Preferably, the clock signal includes a plurality of types of clock signals.

Preferably, the crystal circuit is connected to the Central Processing Unit, and the connection line for outputting the clock signals is selected for the shortest length within a standard length range.

The beneficial effects of the invention: the operation is simple and it does not need to buy an expensive oscilloscope, the accurate precision of the PLL can be measured without the influence of the crystal.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
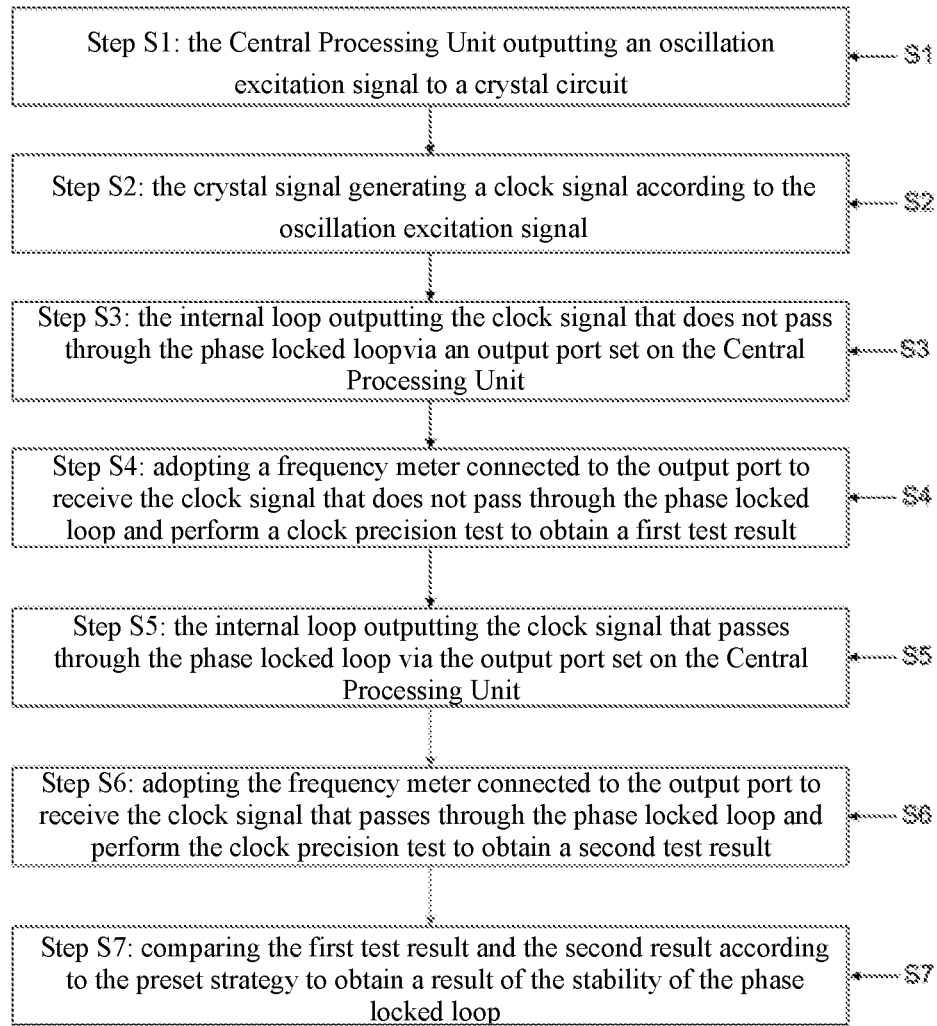
FIG. 1 is a schematic flow chart of a method for measuring the stability of an internal Phase Locked Loop of a Central Processing Unit by a frequency meter in a preferred embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

Hereinafter, certain exemplary embodiments according to the present disclosure will be described with reference to the accompanying drawings.

Figure 2:
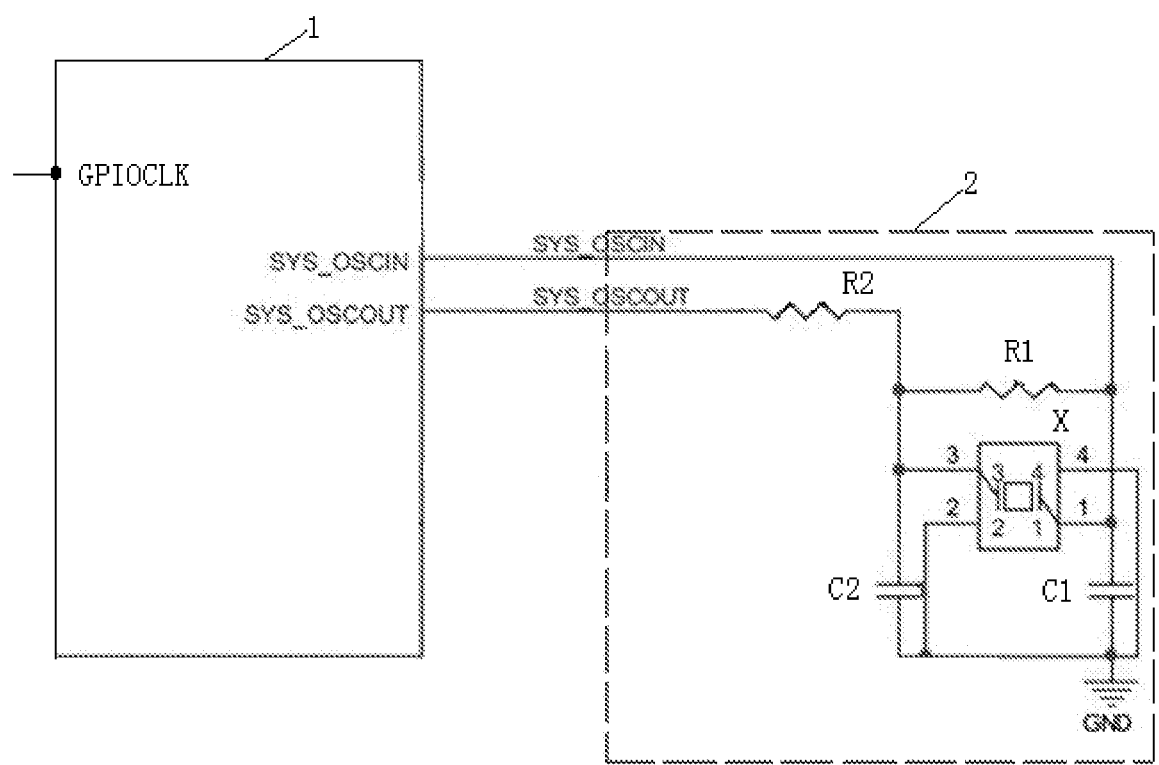
FIG. 2 is a schematic view of a Central Processing Unit in a preferred embodiment of the present invention.

In the method for measuring the stability of an internal Phase Locked Loop of a Central Processing Unit by a frequency meter as shown in FIGS. 1 to 2, the Central Processing Unit includes an internal loop 1 and a crystal circuit 2; the method including:

Step S1: the Central Processing Unit outputting an oscillation excitation signal to the crystal circuit 2 through SYS_CSOOUT;

Step S2: according to the oscillation excitation signal, the crystal circuit 2 generating a clock signal, which is then received by the internal loop through SYS_CSOOUT;

Step S3: the internal loop 1 outputting the clock signal that does not pass through the phase locked loop via an output port (GPIOCLK) set on the Central Processing Unit;

Step S4: a frequency meter (not shown in the figures) connected to the output port receiving the clock signal that does not pass through the phase locked loop and perform a clock precision test to obtain a first test result;

Step S5: the internal loop 1 outputting the clock signal that passes through the phase locked loop via the output port set on the Central Processing Unit;

Step S6: adopting the frequency meter connected to the output port to receive the clock signal that passes through the phase locked loop and perform the clock precision test to obtain a second test result; and Step S7: comparing the first test result and the second result according to a preset strategy to obtain a result of the stability of the phase locked loop.

In the embodiment shown as FIG. 2, the right side is the crystal circuit 2 of the CPU, the left side is the internal loop 1 of the CPU. From the FIG. 2, we can find that the crystal signal SYS_OSCIN can be directly and internally output to the CLKOUT on the left side. The clock signal that does not pass through the PLL and the clock signal that passes through the PLL are respectively output through the internal loop 1 and the respective clock frequency accuracy of the two types of clock signals is measured by the frequency meter to obtain the first test result and the second test result. According to the preset strategy, comparing the first test result and the second test result to obtain a result of the stability of the phase locked loop.

Mainly, through the internal loop 1 of the CPU, using the frequency meter to measure the frequency precision from the CPU to crystal and then using the frequency meter to measure the clock which is output after passing through the PLL, and comparing the precision of the two, we can get the accuracy of the PLL, so that we can determine whether the PLL is stable. It is advantageous from the above that there is no need to purchase an expensive oscilloscope, and the operation is simple, the influence of the crystal can be avoided, and the accurate precision of the PLL can be measured.

In a preferred embodiment, the crystal circuit 2 includes:
a passive crystal oscillator X, the passive crystal oscillator X including a first pin for inputting the clock signal to the internal loop 1, a third pin for receiving the oscillation excitation signal from the Central Processing Unit, a second pin and a fourth pin being grounded respectively;
a first resistor R1, which is connected in parallel with the circuit between the third pin and the fourth pin of the passive crystal oscillator X;
a second resistor R2, through which the third pin of the passive crystal oscillator X is connected to the internal loop 1;
a first capacitor C1, through which the first pin of the passive crystal oscillator X is grounded;
a second capacitor, through which the third pin of the passive crystal oscillator X is grounded.

In a preferred embodiment, the first capacitor C1 is directly connected to the ground of the Central Processing Unit.

In a preferred embodiment, the second capacitor C2 is directly connected to the ground of the Central Processing Unit.

In a preferred embodiment, the preset strategy is as follows:
if it is determined that the deviation between the first test result and the second test result is greater than the preset result, then the phase locked loop is determined as unstable;
if it is determined that the deviation between the first test result and the second test result is less than the preset result, then the phase locked loop is determined as stable.

In a preferred embodiment, the output port includes a first sub-output port and a second sub-output port.

In a preferred embodiment, in Step S3, the first sub-output port is adopted to output the clock signal that does not pass through the phase locked loop.

In a preferred embodiment, in Step S5, the second-output port is adopted to output the clock signal that does not pass through the phase locked loop.

In the present embodiment, either different output ports (such as the first sub-output port and the second sub-output port) or the same sub-output port (such as the first sub-output port or the second sub-output port) can be applied to output the clock signal that does not pass through the PLL and the clock signal that passes through the PLL.

In a present embodiment, the clock signal includes a plurality of types of clock signals.

In the present embodiment, comparing the precision of the clock signal, such as I2S_AM_CLK or other clocks output after passing through the PLL, measured and recorded by a frequency meter with the precision of the CPU previously measured, we can know whether the PLL is stable.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A method for measuring the stability of an internal phase locked loop of a central processing unit by a frequency meter, the central processing unit comprising an internal loop and a crystal circuit, the method comprising:
    Step S1: outputting by the central processing unit an oscillation excitation signal to the crystal circuit;
    Step S2: generating by the crystal circuit a clock signal according to the oscillation excitation signal;
    Step S3: outputting by the internal loop the clock signal that does not pass through the phase locked loop via an output port set on the central processing unit;
    Step S4: adopting a frequency meter connected to the output port to receive the clock signal that does not pass through the phase locked loop and perform a clock precision test to obtain a first test result;
    Step S5: outputting by the internal loop the clock signal that passes through the phase locked loop via the output port set on the central processing unit;
    Step S6: adopting the frequency meter connected to the output port to receive the clock signal that passes through the phase locked loop and perform the clock precision test to obtain a second test result; and
    Step S7: comparing the first test result and the second result according to a preset strategy to obtain a result of the stability of the phase locked loop.

2. The method according to claim 1, wherein the crystal circuit comprises:
    a passive crystal oscillator, the passive crystal oscillator comprising a first pin for inputting the clock signal to the internal loop, a third pin for receiving the oscillation excitation signal from the central processing unit, a second pin and a fourth pin being grounded respectively;
    a first resistor, which is connected in parallel with the circuit between the third pin and the fourth pin of the passive crystal oscillator;
    a second resistor, through which the third pin of the passive crystal oscillator is connected to the internal loop;
    a first capacitor, through which the first pin of the passive crystal oscillator is grounded; and
    a second capacitor, through which the third pin of the passive crystal oscillator is grounded.

3. The method according to claim 2, wherein the first capacitor is directly connected to the ground of the central processing unit.

4. The method according to claim 2, wherein the second capacitor is directly connected to the ground of the central processing unit.

5. The method according to claim 1, wherein the preset strategy is as follows:
    if it is determined that the deviation between the first test result and the second test result is greater than a preset result, then the phase locked loop is determined as unstable;
    if it is determined that the deviation between the first test result and the second test result is less than the preset result, then the phase locked loop is determined as stable.

6. The method according to claim 1, wherein the output port comprises a first sub-output port and a second sub-output port.

7. The method according to claim 6, wherein in Step S3, the first sub-output port is adopted to output the clock signal that does not pass through the phase locked loop.

8. The method according to claim 6, wherein in Step S5, the second sub-output port is adopted to output the clock signal that does not pass through the phase locked loop.

9. The method according to claim 1, wherein the clock signal comprises a plurality of types of clock signals.

* * * * *